US006906594B2

(12) United States Patent
Womac

(10) Patent No.: US 6,906,594 B2
(45) Date of Patent: Jun. 14, 2005

(54) METHOD AND SYSTEM FOR CORRECTING NON-LINEAR RESPONSE IN AMPLIFIERS

(75) Inventor: Michael D. Womac, McKinney, TX (US)

(73) Assignee: Microtune (Texas), L.P., Plano, TX (US)

(*) Notice: Subject to any disclaimer, the term of this patent is extended or adjusted under 35 U.S.C. 154(b) by 79 days.

(21) Appl. No.: 10/454,195

(22) Filed: Jun. 4, 2003

(65) Prior Publication Data

US 2004/0246054 A1 Dec. 9, 2004

(51) Int. Cl.[7] .................................................. H03F 3/04
(52) U.S. Cl. ...................................... 330/296; 330/311
(58) Field of Search ................................ 330/296, 285, 330/310, 311, 98, 150

(56) References Cited

U.S. PATENT DOCUMENTS

| 5,923,215 | A | | 7/1999 | Hans .......................... 330/149 |
|---|---|---|---|---|
| 6,023,196 | A | | 2/2000 | Ashby et al. ................ 330/290 |
| 6,492,869 | B1 | * | 12/2002 | Kuriyama ................... 330/133 |
| 6,756,852 | B2 | * | 6/2004 | Chen .......................... 330/296 |
| 6,791,418 | B2 | * | 9/2004 | Luo et al. ................... 330/296 |
| 2003/0038679 | A1 | | 2/2003 | Schaffer ...................... 330/296 |

FOREIGN PATENT DOCUMENTS

EP  0 534 007 A1  9/1991  ............. H03F/1/32

OTHER PUBLICATIONS

"The Relationship of Intercept Points and Composite Distortions," Matrix Technical Notes MTN–109, *Matrix Test Equipment 90–11*, http://www.matrixtest.com @ Internet, Feb. 18, 1998 (printed Mar. 17, 2003), 6 pages.
"Some Notes on Composite Second and Third Order Intermodulation Distortions," Matrix Technical Notes MTN–108, *Matrix Test Equipment 90–11*, http://www.matrixtest.com @ Internet, Dec. 15, 1998, (printed Mar. 17, 2003), 12 pages.
"Derivation for 2nd–order intercept point for two cascaded stages," *Arden Technologies, Inc.*, 2000, 1 page.
"Derivation for 3rd–order intercept point for two cascaded stages," *Arden Technologies, Inc.*, 2000, 1 page.
Stephan Van Fleteren, "Merits of Solid State Power Amplifiers and Traveling Wave Tubes Amplifiers for Satellite Communication Applications," *Communications and Power Industries*, http://www.cpii.com @ Internet, 2000 (printed Feb. 24, 2003), 4 pages.
"Third Order Intercept Measurements," *Agilent Technologies*, Feb. 15, 2001, 7 pages.
Thomas Weldon, "Cascade Analysis" presentation, *Thomas Weldon, University of North Carolina at Charlotte*, 2002.11 pages.
"Mathematical Definitions and Derivations—Intermodulation Calculations," http://www.ardentech.com @ Internet, printed Mar. 17, 2003, 4 pages.
"AMF Amplifier Products," http://www.miteq.com @ Internet, printed Mar. 17, 2003, 2 pages.
PCT Search Report for PCT/US2004/016807, 14 pages.

* cited by examiner

*Primary Examiner*—Henry Choe
(74) *Attorney, Agent, or Firm*—Baker Botts L.L.P.

(57) ABSTRACT

A method for extending the linear range of operation of an amplifier includes monitoring a transistor voltage of a transistor of an amplifier. The transistor is coupled to a variable current source applying a bias current to the transistor. The method continues by monitoring an output voltage of the amplifier and by determining whether the transistor voltage is within a predetermined range of the output voltage. If the transistor voltage is not within a predetermined range of the output voltage, the method continues by decreasing the bias current applied to the transistor. If the transistor voltage is within a predetermined range of the output voltage and if the bias current has not previously been decreased, the method continues by increasing the bias current applied to the transistor.

21 Claims, 3 Drawing Sheets

METHOD AND SYSTEM FOR CORRECTING NON-LINEAR RESPONSE IN AMPLIFIERS

TECHNICAL FIELD OF THE INVENTION

This invention relates in general to amplifiers, and more particularly to a method and system for correcting non-linear response in amplifiers.

BACKGROUND OF THE INVENTION

Amplifier design involves many diverse considerations. Such considerations include gain of the amplifier, noise figure, and linearity of amplifier response. Furthermore, in integrated circuit design, amplifiers may be limited in the amount of headroom available to components of the amplifier. It is desirable, therefore, to correct any non-linear responses in an amplifier without significantly increasing noise or requiring too much headroom.

SUMMARY OF THE INVENTION

In accordance with the present invention, an amplifier circuit maintains linearity using a correction circuit. This increases the range of input voltages under which the amplifier produces a linear output response. In particular, certain embodiments of the present invention use transistor feedback to correct non-linear responses of the amplifier circuit.

According to a particular embodiment, a method for extending the linear range of operation of an amplifier includes monitoring a transistor voltage of a transistor of an amplifier. The transistor is coupled to a variable current source applying a bias current to the transistor. The method continues by monitoring an output voltage of the amplifier and by determining whether the transistor voltage is within a predetermined range of the output voltage. If the transistor voltage is not within a predetermined range of the output voltage, the method continues by decreasing the bias current applied to the transistor. If the transistor voltage is within a predetermined range of the output voltage and if the bias current has not previously been decreased, the method continues by increasing the bias current applied to the transistor.

Important technical advantages of certain embodiments of the present invention include extending the linear range of an amplifier without increasing the noise in an amount proportional to the degree that the linear range is extended. Certain embodiments of the present invention use correction circuits that increase the range of linearity without adding significant resistance to the amplifier circuit. This broadens the range of input voltages over which the amplifier responds linearly, and it does so without providing accompanying thermal noise that is associated with the inclusion of resistors in circuits. Thus, such embodiments provide a technique for improving the usefulness of amplifiers without increasing the noise beyond an unacceptable level.

Other important technical advantages of certain embodiments of the present invention include an amplifier that provides a high gain level. Often, amplifiers with high gain require additional resistors and other components to maintain linearity across the necessary operating range. In addition to increasing the noise of the amplifier, such components may also take up headroom in an integrated circuit, thus decreasing their utility as part of compact electronic devices. The use of non-resistive correction circuits in high gain amplifiers preserves a degree of linearity without requiring additional resistive components that contribute noise or use headroom.

Other technical advantages of the present invention will be readily apparent to one skilled in the art from the figures, descriptions, and claims included herein. Moreover, while specific advantages have been enumerated above, various embodiments may include all, some, or none of the enumerated advantages.

BRIEF DESCRIPTION OF THE DRAWINGS

For a more complete understanding of the present invention and its advantages, reference is now made to the following description, taken in conjunction with the accompanying drawings, in which.

DETAILED DESCRIPTION OF THE INVENTION

Figure 1:
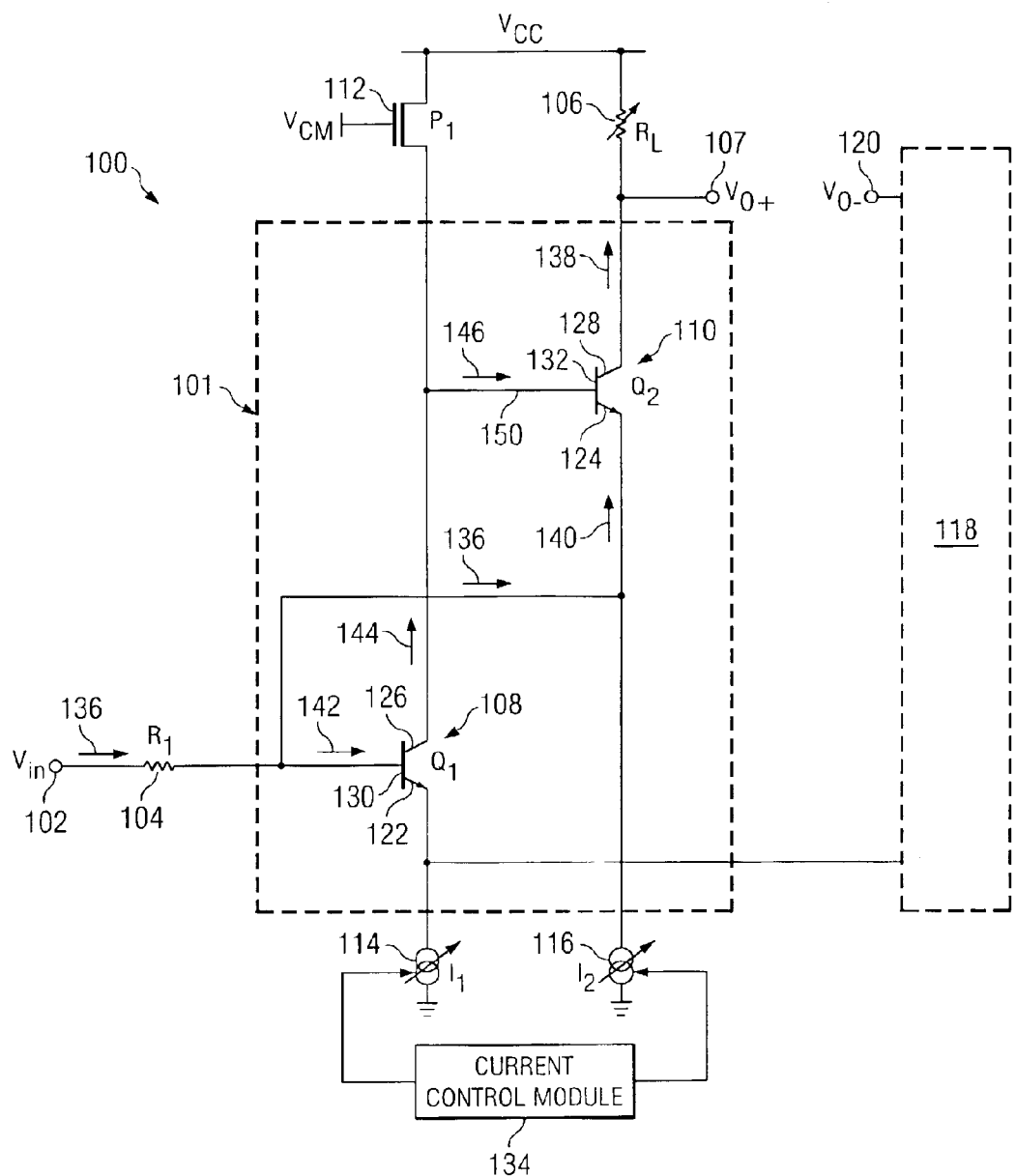
FIG. 1 is an amplifier circuit, according to a particular embodiment of the present invention.

FIG. 1 illustrates an amplifier circuit 100 that includes a correction circuit 101, a resistor 104, a variable resistor 106, a constant current source 112, first variable bias current source 114, a second variable bias current source 116, and a current control module 134. Correction circuit 101 includes transistors 108 and 110 to provide corrections to non-linear fluctuations associated with amplifier circuit 100. Resistor 106, current sources 114 and 116, and current control module 134 operate to extend the linear range of operation of amplifier circuit 100. Circuit 100 also includes a mirror half circuit 118 that represents the mirror images of the components presented above.

Figure 2:
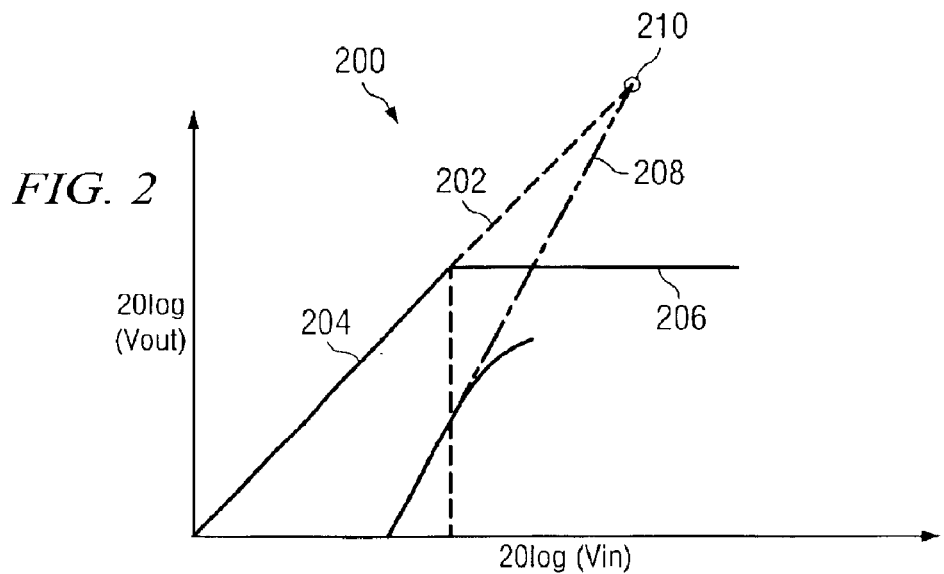
FIG. 2 is an example of a characteristic graph used to measure the linearity of an amplifier.

Before proceeding with the description of FIG. 1, it is useful to provide some description of the concept of linearity as applied to amplifiers. FIG. 2 is a graph 200 that illustrates the output third-order intercept (OIP3) 210 of an amplifier, a useful value for characterizing the linearity of the amplifier. In general, it is desirable for amplifiers to produce an output signal that varies linearly with the input signal. The linearity of an amplifier may be adversely affected by component limitations and by non-linear distortion contributed by the amplifier itself, particularly near the limits of the normal operating range. The OIP3 210 is an extrapolated figure of merit of the limits of the amplifier's ability to respond linearly under such conditions.

The OIP3 210 of an amplifier represents the intersection of two characteristic lines for the amplifier, plotted on a graph 200 of output voltage versus input voltage. The first line 202 is an extension of the linear portion 204 of the output voltage versus input voltage curve 206 for the amplifier. Until a certain input voltage is reached, the amplifier produces a linear output response to input voltage, but once the amplifier becomes saturated, the output voltage becomes less sensitive to input voltage, and the slope of the output-versus-input curve 206 decreases. The portion of the output-versus-input curve 206 before saturation is reached is the linear portion 204, which may be extended in a straight line 202. The second line 208, which intercepts the first line at the OIP3 210, is a plot of the difference between the amplitude of the fundamental signal and the amplitude of a particular third-order intermodulation signal produced by the amplifier when a signal slightly off of the frequency of a fundamental signal frequency is introduced. Thus, the second line 208 provides an indirect measurement of the amount of non-linear distortion contributed by the amplifier.

The OIP3 210 takes into account the component limitations of the amplifier (first line 202) and the amount of non-linear distortion (second line 208) introduced by the amplifier to provide an indication of the overall linearity of the amplifier. A higher OIP3 210 indicates a better linear response from the amplifier, so when the subsequent description makes reference to increasing the degree of linearity, such descriptions can be understood in the context of linearity as measured by the OIP3 210. Effectively, when correction circuit 101 suppresses a non-linear response in amplifier circuit 100, the output-versus-input response of circuit 100 changes, effectively increasing the OIP3 210 of circuit 100. The following description explains the components of circuit 100 and the techniques by which correction circuit 101 corrects non-linear fluctuations in amplifier circuit 100.

With that context, it is expedient to return to the description of particular components of circuit 100 in FIG. 1. Resistor 104 and variable resistor 106 represent any suitable components for providing electrical resistance to a current flow. The resistance value of resistor 104 represents the input impedance of circuit 100. Variable resistor 106 has an adjustable resistance. The resistance of variable resistor 106 is selected to adjust the gain of circuit 100. Variable resistor 106 may have a resistance value that is selectable continuously across a certain range, or alternatively, variable resistor 106 may have discrete resistance values that are selectable.

Transistors 108 and 110 represent NPN-type transistors. The current flow through transistors 108 and 110 is controlled by the voltage applied to respective bases 130 and 132 of transistors 108 and 110. The ratio of the change in collector current as compared to the change in base voltage over a defined interval is known as the transconductance, which is a measure of the performance of transistors 108 and 110 as feedback devices.

Constant current source 112 represents any device or component capable of producing a sustained current. In the depicted embodiment, constant current source 112 is a p-type field effect transistor (FET) with a common mode voltage $V_{cm}$ applied. The effectiveness of constant current source 112 at producing a constant current may vary depending on the range of voltage and/or current at which constant current source 112 is operating. In particular, the load on a power supply (not shown), supplying $V_{cm}$ to constant current source 112 may become too high for the power supply to produce $V_{cm}$ consistently. Thus, it may be useful to monitor the operating range of constant current source 112 to maintain consistent functioning.

Variable bias current sources 114 and 116 represent any source of a defined amount of current into circuit 100. Current sources 114 and 116 are controlled by any suitable device or component, represented by current control module 134. Current control module 134 may include processors, memory, manual controls, comparators, or any other suitable elements, components, or devices for monitoring various aspects of circuit 100 and for adjusting the currents generated by sources 114 and 116, in response. In particular embodiments, current control module 134 may monitor quantities such as input voltage 102, output voltage 107, transistor voltage 150, or any other suitable characteristic of circuit 100 and, in response, determine an appropriate current level for current sources 114 and 116 to extend the linear range of operation for amplifier circuit 100.

Mirror half-circuit 118 represents the mirror image of the depicted circuit. Mirror half-circuit 118 is useful for dividing an input signal 102 into a positive and negative component. This allows for averaging to remove second-order harmonic effects in circuit 100. Thus, the use of half-circuit 118 effectively removes certain non-linear effects of amplifier 100, and therefore preserves the linear operation of circuit 100 to a; greater degree. The output voltage 120 of half-circuit 118 is denoted $V_{o-}$ to indicate that it is the negative component of the output 10 voltage.

In operation, an input signal in the form of input voltage 102 is coupled to circuit 100 at a first terminal of resistor 104. Input voltage 102 produces a current 136 through resistor 104. Current 136 flows to emitter 124 of transistor 110, which in turn affects the collector current 138 of transistor 110. The collector (ac) current 138 thus produced is equal to (ac) current 136. This produces a voltage across variable resistor 106, which is the output voltage 107. Because output voltage 107 is proportional to the resistance of variable resistor 106, the gain $V_o/V_{in}$ equals $R_L/R_1$, and the gain of circuit 100 is adjustable by adjusting variable resistor 106.

Because transistor 110 is a real device and not a theoretically ideal component, transistor 110 may produce non-linear responses that cause fluctuations in the collector current 138 of transistor 110, which causes non-linear variations in output voltage 107. In particular, when transistor 110 is operating near the limits of its operating range or in high-gain configurations, the non-linear effects may become unacceptably high.

Transistor 108 compensates for the fluctuations in transistor 110 by detecting the fluctuations and producing a current that compensates for the fluctuations. When a fluctuation in transistor 110 produces a fluctuation in collector current 138, that fluctuation also affects the emitter current 140 of transistor 110. Base 130 transistor 108 is coupled to emitter 124 of transistor 110, so that the change in emitter current 140 produces a corresponding change in base current 142 of transistor 108, resulting in a change in the collector current 144 of transistor 108. Because both collector 126 of transistor 108 and base 132 of transistor 110 are coupled to constant current source 112, the change in collector current 144 produces an equal and opposite change in base current 146 of transistor 110. This change in base current 146 in turn produces a change in the collector current 138 of transistor 110 that effectively negates the non-linear fluctuation of transistor 110. Consequently, the depicted circuit automatically compensates for non-linear fluctuations produced by transistor 110, allowing transistor 110 to continue responding linearly even when it might otherwise introduce non-linear fluctuations.

Although circuit 101 is detailed with reference to a specific arrangement and operation of transistors 108 and 110, it should be understood that circuit 101 may include any arrangement and operation of transistors or other components to reduce the non-linear variations in output voltage 107.

The ability of correction circuit 101 to effectively correct non-linear responses is influenced by the amount of bias currents $I_1$ and $I_2$ applied by variable bias current sources 114 and 116. An increase in bias currents $I_1$ and $I_2$ produces a corresponding increase in the transconductance of the respective transistor 108 or 110, which in turn increases the responsiveness of that transistor 108 or 110 to stimuli. In general, this increases the ability of correction circuit 101 to respond to non-linear fluctuations. But higher bias currents $I_1$ and $I_2$ may also place strain on the ability of components, such as transistors 108 and 110 and constant current source 112, to function ideally. Furthermore, imbalances in bias currents $I_1$ and $I_2$ may affect the ability of transistor 108 to respond proportionally to fluctuations in transistor 110. Consequently, it may be desirable to adjust the values of bias currents $I_1$ and $I_2$ from time to time using current control module 134 depending on the range of input voltage 102 over which circuit 100 is operating and the expected level of non-linear responses.

One advantage of certain embodiments of correction circuit 101 is that correction circuit 101 includes no resistors. In existing systems, the linear region of an amplifier circuit can be expanded by introducing degeneration resistors into the circuit. Degeneration resistors draw a portion of the signal generated across a transistor away into the degeneration resistor. Although this improves the linear feedback of the transistor by avoiding saturation of the transistor, it also contributes noise from thermal activity in the resistor that is proportional to the resistance value of the resistor. Since the amount of signal degeneration, and the resulting degree of linearity compensation, is also proportional to the resistance, such compensation using resistors also makes a proportional contribution to the noise. By contrast, the degree of linearity compensation provided by correction circuit 101 does not introduce a degree of noise proportional to the degree of linearity compensation achieved. Thus, the linear range of operation of circuit 100 is expanded without a proportionate contribution to the noise of circuit 100.

Another advantage of certain embodiments of circuit 100 is the use of components that take up less headroom. Resistors, particularly those with relatively high resistance values, require a relatively large amount of voltage in an integrated circuit compared to transistors 108 and 110, and reduce the amount of voltage available for other components of the integrated circuit. Using correction circuit 101 provides a method for increasing linearity that requires less voltage than the use of resistors. This allows the gain of the amplifier to be increased without reducing the available voltage of the integrated circuit.

Figure 3:
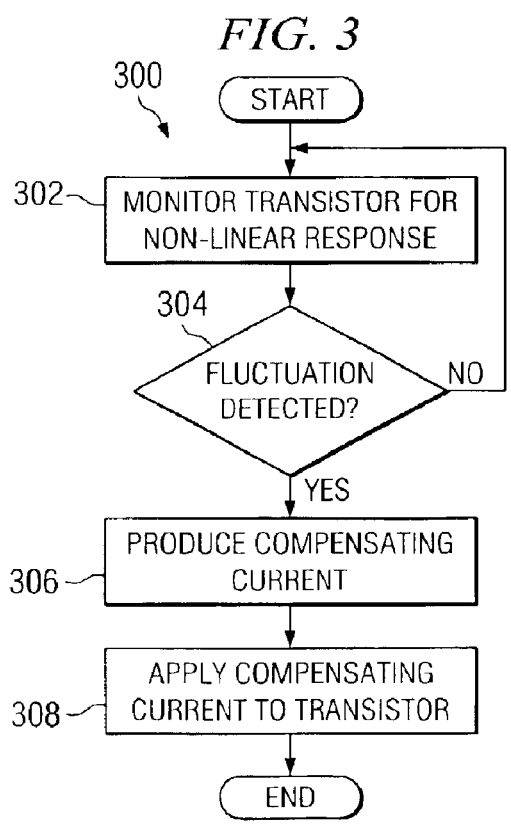
FIG. 3 is a flowchart illustrating the response of a correction circuit to a non-linear fluctuation.

FIG. 3 is a flowchart that illustrates the response of correction circuit 101 to a non-linear fluctuation of amplifier circuit 100. Circuit 101 monitors transistor 110 for a non-linear response at step 302. In circuit 100 depicted in FIG. 1, this function is performed by transistor 108 in that base current 142 of transistor 108 provides an indication of non-linear fluctuations in emitter current 140 of transistor 110. At decision step 304, circuit 101 determines if a fluctuation has been detected. This corresponds to a response produced in transistor 108 by a fluctuation in base current 142. If no fluctuation is detected, circuit 101 continues to monitor for a non-linear response at step 302. If a fluctuation is detected, then circuit 101 produces a compensation current, which is any current used to correct the non-linear response of amplifier circuit 100 such as, for example, current 144, current 146, or any suitable combination of both.

To correct a non-linear response, circuit 101 produces an appropriate amount of compensation current at step 306. In the embodiment depicted in FIG. 1, this is automatically performed by the relationship between base current 142 and collector current 144 in transistor 108. Circuit 101 then applies the compensation current to transistor 110 at step 308. Transistor 108 applies the compensation current by drawing more or less current from constant current source 112, which in turn changes base current 146 of transistor 110. The result of that application is a correction of the detected non-linear fluctuation, thus preserving the linear response of amplifier circuit 100.

Figure 4:
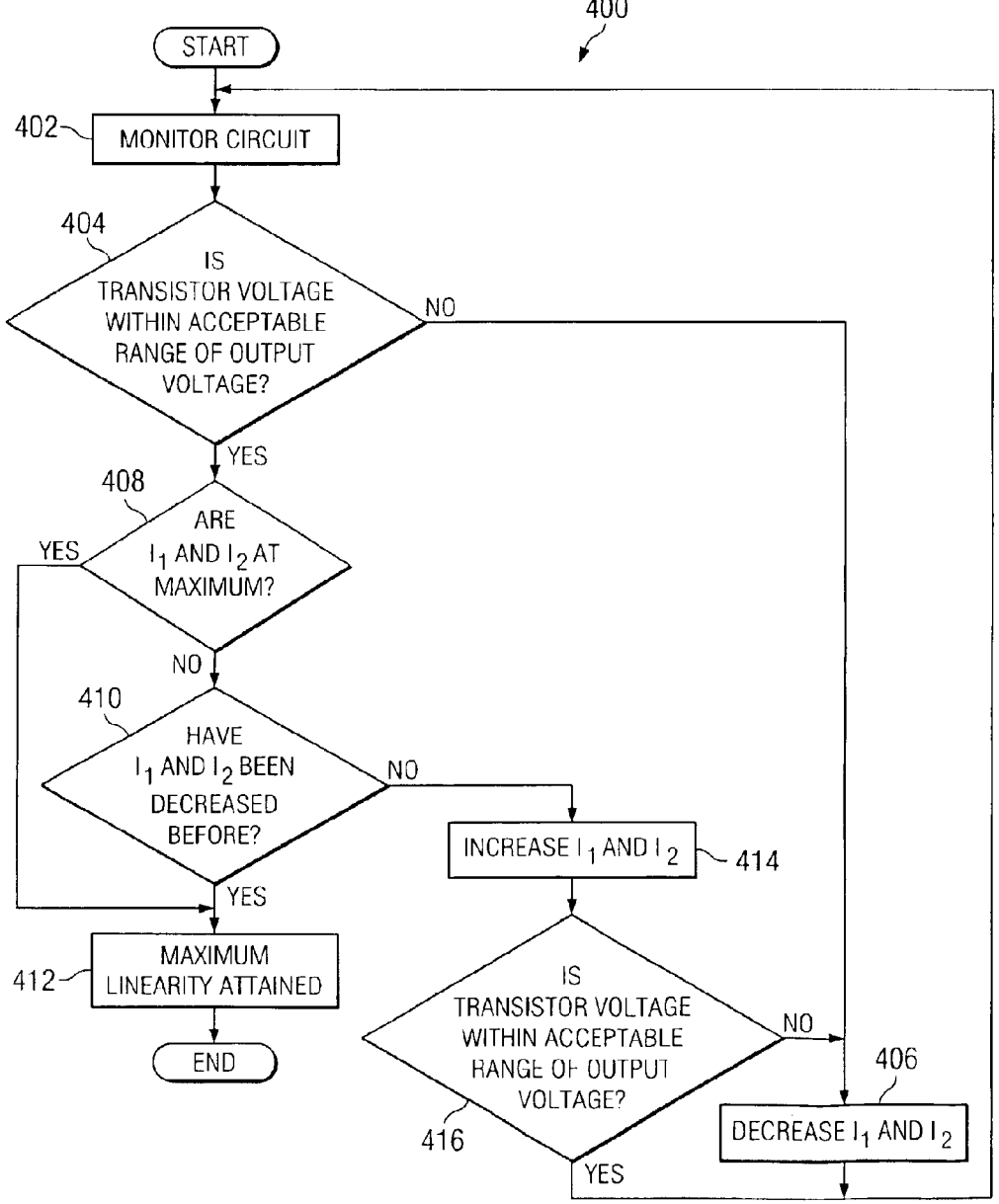
FIG. 4 is a flowchart illustrating a method for adjusting bias currents to extend the linear range of an amplifier circuit.

FIG. 4 is a flowchart 400 that illustrates a method for adjusting bias currents $I_1$ and $I_2$ in circuit 100 to extend the linear range of operation of amplifier circuit 100. In particular, the example method provided shows the responses of components to adjustment of bias currents $I_1$ and $I_2$ from sources 114 and 116, and considerations that affect setting the value of sources 114 and 116. At step 402, current control module 134 monitors circuit 100 to determine whether it is operating in a linear range. In particular, module 134 compares output voltage 107 to transistor voltage 150 at base 132 of transistor 110.

Execution proceeds to step 404 where module 134 determines whether transistor voltage 150 is within an acceptable range of output voltage 107. The acceptable range between transistor voltage 150 and output voltage 107 may vary depending upon the particular application of amplifier circuit 100. Therefore, in certain circumstances, transistor voltage 150 is within an acceptable range of output voltage 107 if it is equal to or less than output voltage 107, but is not within an acceptable range of output voltage 107 if it is greater than output voltage 107. In other circumstances, transistor voltage 150 is within an acceptable range of output voltage 107 if it is a particular amount less than output voltage 107, but is not within an acceptable range of output voltage 107 otherwise. In still other circumstances, transistor voltage 150 is not within an acceptable range of output voltage 107 if transistor 110 is saturated. Saturation occurs when the base-collector junction of transistor 110 becomes forward biased or when transistor 110 is subject to an amount of current that exceeds the ability of transistor 110 to respond linearly because of parasitic resistances that forward bias the base-collector junction, which may disturb the described operation of circuit 100.

If transistor 100 is not within an acceptable range of output voltage 107, which may indicate that a non-linear fluctuation has occurred in amplifier circuit 100, execution proceeds to step 406 where current control module 134 decreases bias currents $I_1$ and $I_2$ provided by current sources 114 and 116, respectively. Execution returns to step 402 where current control module 134 continues to monitor circuit 100. If transistor 110 is within an acceptable range of output voltage 107, as determined at step 404, execution proceeds to step 408.

At step 408, it is determined whether bias currents $I_1$ and $I_2$ are at a maximum value as determined by the capacity of current sources 114 and 116, respectively. If not, execution proceeds to step 410 where module 134 determines whether bias currents $I_1$ and $I_2$ have been decreased before. If bias currents $I_1$ and $I_2$ have been decreased before, as determined at step 410, or if bias currents $I_1$ and $I_2$ are at a maximum, as determined at step 408, then execution proceeds to step 412 where module 134 determines that maximum linearity has been attained for the operation of circuit 100.

If bias currents $I_1$ and $I_2$ have not been decreased before, as determined at step 410, execution proceeds to step 414 where bias currents $I_1$ and $I_2$ are increased. Execution then proceeds to step 416 where module 134 again determines whether transistor voltage 150 is within an acceptable range of output voltage 107. If so, execution returns to step 402 where module 134 continues to monitor circuit 100. If not, execution proceeds to step 406 where module 134 decreases bias currents $I_1$ and $I_2$, and execution returns to step 402.

Although the present invention has been described with several embodiments, a myriad of changes, variations, alterations, transformations, and modifications may be suggested to one skilled in the art, and it is intended that the present invention encompass such changes, variations, alterations, transformations, and modifications as fall within the scope of the appended claims.

What is claimed is:

1. A method for extending the linear range of operation of an amplifier, comprising:
    monitoring a transistor voltage of a transistor of an amplifier, the transistor coupled to a variable current source applying a bias current to the transistor;
    monitoring an output voltage of the amplifier;
    determining whether the transistor voltage is within a predetermined range of the output voltage;
    if the transistor voltage is not within a predetermined range of the output voltage, decreasing the bias current applied to the transistor; and
    if the transistor voltage is within a predetermined range of the output voltage and if the bias current has not previously been decreased, increasing the bias current applied to the transistor.

2. The method of claim 1, wherein the transistor voltage is determined to be within the predetermined range when the transistor voltage is equal to or no more than a predetermined amount less than the output voltage.

3. The method of claim 1, wherein the transistor voltage is determined to be outside the predetermined range if the transistor is saturated.

4. The method of claim 1, wherein increasing the bias current applied to the transistor comprises increasing the bias current to a maximum current provided by the variable current source.

5. The method of claim 1, wherein:
    the variable current source is a first variable current source applying a first bias current;
    the transistor is a first transistor; and
    the method further comprises adjusting a second bias current applied by a second variable current source to a second transistor having at least one terminal coupled to the first transistor in response to any adjustment of the first bias current.

6. The method of claim 1, wherein the output voltage of the amplifier is proportional to an output current of the transistor, the method further comprising:
    detecting a non-linear fluctuation in the output current of the transistor;
    generating a compensation current associated with the non-linear fluctuation; and
    applying the compensation current to the transistor.

7. The method of claim 6, wherein:
    the transistor comprises a first transistor;
    the compensation current is generated by a second transistor coupled to the first transistor; and
    the first and second transistors are further coupled to a constant current source.

8. The method of claim 1, wherein the steps of the method are implemented in an integrated circuit.

9. An amplifier, comprising:
    a transistor;
    a variable current source coupled to the transistor operable to apply a bias current to the transistor; and
    a current control module operable to:
        monitor a transistor voltage of the transistor;
        monitor an output voltage of the amplifier;
        determine whether the transistor voltage is within a predetermined range of the output voltage;
        decrease the bias current applied to the transistor if the transistor voltage is not within a predetermined range of the output voltage;
        increase the bias current applied to the transistor if the transistor voltage is within a predetermined range of the output voltage and the bias current has not previously been decreased.

10. The amplifier of claim 9, wherein the transistor voltage is determined to be within the predetermined range when the transistor voltage is equal to or no more than a predetermined amount less than the output voltage.

11. The amplifier of claim 9, wherein the transistor voltage is determined to be outside the predetermined range if the transistor is saturated.

12. The amplifier of claim 9, wherein the current control module increases the bias current applied to the transistor to a maximum current provided by the variable current source.

13. The amplifier of claim 9, wherein:
    the variable current source is a first variable current source applying a first bias current;
    the transistor is a first transistor;
    the amplifier further comprises:
        a second transistor having at least one terminal coupled to the first transistor; and
        a second variable current source coupled to the second transistor operable to apply a second bias current to the second transistor; and
    the current control module is further operable to adjust the second bias current in response to an adjustment of the first bias current.

14. The amplifier of claim 9, wherein:
    the output voltage of the amplifier is proportional to an output current of the transistor; and
    the transistor comprises a first transistor;
    the amplifier further comprising a second transistor having at least one terminal coupled to the first transistor, the second transistor operable to:
        detect a non-linear fluctuation associated with the output current of the first transistor;
        generate a compensation current in response to detecting the non-linear fluctuation; and
        apply the compensation current to the first transistor.

15. An amplifier, comprising:
    a first transistor;
    a second transistor having at least one terminal coupled to the first transistor;
    a first variable current source coupled to the first transistor and operable to apply a first bias current to the first transistor;
    a second variable current source coupled to the second transistor and operable to apply a second bias current to the second transistor; and
    a current control module operable to:
        monitor a transistor voltage of the first transistor;
        monitor an output voltage of the amplifier;
        determine whether the transistor voltage is within a predetermined range of the output voltage;
        decrease the first bias current if the transistor voltage is not within a predetermined range of the output voltage;

increase the first bias current if the transistor voltage is within a predetermined range of the output voltage and the first bias current has not previously been decreased.

16. The amplifier of claim 15, wherein the transistor voltage is determined to be within the predetermined range when the transistor voltage is equal to or no more than a predetermined amount less than the output voltage.

17. The amplifier of claim 15, wherein the transistor voltage is determined to be outside the predetermined range if the first transistor is saturated.

18. The amplifier of claim 15, wherein the current control module increases the first bias current applied to the first transistor to a maximum current provided by the first variable current source.

19. The amplifier of claim 15, wherein the current control module is further operable to adjust the second bias current in response to an adjustment of the first bias current.

20. The amplifier of claim 15, wherein the output voltage of the amplifier is proportional to an output current of the first transistor, and the second transistor operable to:

detect a non-linear fluctuation associated with the output current of the first transistor;

generate a compensation current in response to detecting the non-linear fluctuation; and apply the compensation current to the first transistor.

21. A system, comprising:

means for monitoring a transistor voltage of a transistor of an amplifier, the transistor coupled to a variable current source applying a bias current to the transistor;

means for monitoring an output voltage of the amplifier;

means for determining whether the transistor voltage is within a predetermined range of the output voltage;

means for decreasing a bias current applied to the transistor if the transistor voltage is not within a predetermined range of the output voltage; and means for increasing the bias current applied to the transistor if the transistor voltage is within a predetermined range of the output voltage and if the bias current has not previously been decreased.

* * * * *